(12) United States Patent
Souma et al.

(10) Patent No.: US 7,750,475 B2
(45) Date of Patent: Jul. 6, 2010

(54) LEAD-FREE SOLDER BALL

(75) Inventors: Daisuke Souma, Tochigi (JP); Takahiro Roppongi, Tochigi (JP); Hiroshi Okada, Mooka (JP); Hiromi Kawamata, Mooka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 10/570,626

(22) PCT Filed: Oct. 6, 2004

(86) PCT No.: PCT/JP2004/014724

§ 371 (c)(1),
(2), (4) Date: Dec. 7, 2006

(87) PCT Pub. No.: WO2005/035180

PCT Pub. Date: Apr. 21, 2005

(65) Prior Publication Data

US 2007/0069379 A1    Mar. 29, 2007

(30) Foreign Application Priority Data

Oct. 7, 2003    (JP) ............................ 2003-347950

(51) Int. Cl.
*H01L 23/48* (2006.01)
*H01L 23/52* (2006.01)
*H01L 23/40* (2006.01)

(52) U.S. Cl. .................. 257/772; 420/560; 420/562; 420/557; 148/400; 228/56.3; 228/180.1; 228/180.22

(58) Field of Classification Search ............... 257/772, 257/E23.024, E23.033; 228/56.3, 180.1, 228/180.22; 420/560, 562, 557; 148/400
See application file for complete search history.

(56) References Cited

U.S. PATENT DOCUMENTS

| | | | | |
|---|---|---|---|---|
| 4,967,313 A | * | 10/1990 | Berner | 361/783 |
| 5,817,194 A | * | 10/1998 | Nagai et al. | 148/400 |
| 6,122,177 A | * | 9/2000 | Kitano et al. | 361/783 |
| 6,179,935 B1 | * | 1/2001 | Yamashita et al. | 148/400 |

(Continued)

FOREIGN PATENT DOCUMENTS

EP    1273384    1/2003

(Continued)

OTHER PUBLICATIONS

M. Amagai et al, "High Solder Joint Reliability with Lead Free Solders", 2003 Proceedings, 53rd Electronic Components and Technology Conference, (ECTC), New Orleans, LA, May 27-30, 2003.

*Primary Examiner*—Lynne A Gurley
*Assistant Examiner*—Meiya Li
(74) *Attorney, Agent, or Firm*—Michael Tobias

(57) ABSTRACT

A Sn—Ag—Cu based lead-free solder ball which does not undergo yellowing of its surface when formed into a solder bump on an electrode of an electronic part such as a BGA package. The solder ball has excellent wettability and does not form voids at the time of soldering, even when it has a minute diameter such as 0.04-0.5 mm. It has a composition comprising 1.0-4.0 mass % of Ag, 0.05-2.0 mass % of Cu, 0.0005-0.005 mass % of P, and a remainder of Sn.

8 Claims, 2 Drawing Sheets

U.S. PATENT DOCUMENTS

| | | |
|---|---|---|
| 6,187,114 B1 * | 2/2001 | Ogashiwa et al. ........... 148/400 |
| 6,517,602 B2 | 2/2003 | Sato et al. .................... 75/255 |
| 6,554,180 B1 | 4/2003 | Katoh et al. ................. 228/224 |
| 6,843,862 B2 * | 1/2005 | Chew et al. ................. 148/400 |
| 2003/0024733 A1 | 2/2003 | Aoyama et al. ............. 174/260 |
| 2007/0243098 A1 * | 10/2007 | Ohnishi et al. .............. 420/560 |

FOREIGN PATENT DOCUMENTS

| | | | |
|---|---|---|---|
| EP | 1464431 | | 10/2004 |
| JP | 3027441 | | 3/1993 |
| JP | 11077366 | | 3/1999 |
| JP | 2000254793 | | 9/2000 |
| JP | 2002057177 | | 2/2002 |
| JP | 2002184240 | | 6/2002 |
| JP | 2004261863 | | 9/2004 |
| KR | 2001107354 A | * | 12/2001 |
| WO | 0103878 | | 1/2001 |

* cited by examiner

LEAD-FREE SOLDER BALL

TECHNICAL FIELD

This invention relates to a lead-free solder ball suitable for use in forming bumps for surface mounted parts such as BGA (ball grid array) packages, including CSP's (chip scale packages).

BACKGROUND ART

In the past, electronic parts were most commonly axial parts having long leads extending from one of the ends of the parts. As electronic parts became smaller and came to require a larger number of leads, electronic parts were developed having short leads disposed on the periphery of the parts. Examples of such parts with peripheral leads are single in-line package (SIP) having leads on one side of a package, and dual in-line packages (DIP) having leads disposed on two sides of a package and quad flat packs (QFP) having leads disposed on four sides of a package. While parts with peripheral leads represent a great improvement with respect to mountability compared to axial parts, they still have a limit with respect to the number of leads which can be installed on a part.

More recently, electronic parts having electrodes provided on the bottom surface of the bodies of the parts have become popular. The bottom surface of the body of an electronic part has a greater surface area than do the sides of the body, so the number of electrodes which can be provided can be greatly increased compared to the number of leads on a part with peripheral leads. To the extent that the number of electrodes of an electronic part can be increased, the number of functions capable of being performed by the electronic part can be increased. A typical example of an electronic part having electrodes on its bottom surface is a BGA (ball grid array) package.

A BGA package typically includes a substrate having a semiconductor integrated circuit (IC) chip mounted on its top surface and an array of electrodes formed on its bottom surface. A rounded mass of solder, referred to as a solder bump, is attached to each of the electrodes. The BGA package can be connected to a printed circuit board, for example, by placing the BGA package atop a printed circuit board with each of the solder bumps of the package contacting a corresponding electrically conducting land of the printed circuit board, and then heating the BGA package and the printed circuit board so as to melt the solder bumps and solder them to the lands. Each of the solder bumps forms a minute soldered joint which mechanically and electrically connects the BGA package to the printed circuit board. The use of solder bumps is advantageous in that it enables a large number of uniform soldered joints to be simultaneously formed on all of the electrodes of a BGA package.

BGA packages can have a wide range of sizes and structures. When a BGA package has roughly the same planar dimensions as the integrated circuit chip mounted on its substrate, it is classified as a CSP (chip scale package). When a BGA package includes a plurality of IC chips, it is classified as a MCM (multi-chip module).

The solder bumps of a BGA package can be formed by a number of methods. One commonly used method employs solder balls. Solder balls have a uniform weight, and their spherical shape makes them easy to supply to appropriate locations on a substrate, so they have an optimal shape for forming bumps on a BGA.

In the past, solder balls for use in forming solder bumps on BGA were most commonly alloys of Sn and Pb, and particularly a 63Sn—Pb alloy, which is the eutectic composition of Sn—Pb alloys. The eutectic composition has a low melting temperature of only 183° C., which is a suitable temperature for avoiding thermal damage of electronic parts, and it also has excellent wettability with respect to the electrodes of a BGA package and the lands of a printed circuit boards. Therefore, a 63Sn—Pb has the excellent property that it produces few soldering defects.

However, it has been found that the use of lead-containing solders, including lead-containing solder balls, is a source of environmental pollution. When electronic parts soldered with a Sn—Pb solder malfunction or become old and are no longer convenient to use, they are disposed of by being discarded. When such equipment is discarded, some portions of the equipment are capable of being reused or recycled. For example, plastics in cases, metals in frames, and precious metals in electronic parts are often recovered. In contrast, a printed circuit board with solder being bonded typically cannot be reused or recycled. Therefore, discarded printed circuit boards are usually pulverized and then disposed of by burial in landfills.

If a printed circuit board which is disposed of by burial employs a lead-containing solder, such as a Sn—Pb solder, and if the printed circuit board is contacted by acid rain having a high pH, lead in the Sn—Pb solder can be dissolved out and mixed with rain water and enter underground water supplies. If humans or livestock drink underground water containing lead over a long period, the lead can accumulate in the body and may cause lead poisoning.

To avoid the environmental and health problems associated with the use of lead-containing solders, there is a movement in the electronics industry towards the use of so-called lead-free solders which do not contain lead.

The most common types of lead-free solders are Sn—Ag based solders, Sn—Cu based solders, Sn—Bi based solders, and Sn—Zn based solders having Sn as a principal component, to which one or more of Ag, Cu, Zn, In, Ni, Cr, Fe, Co, Ge, P, Ga, and the like may be suitably added as additional alloying elements.

Thus, there are various types of lead-free solders. Each types has its own strengths and weaknesses, so the various types differ with respect to use.

In Japanese Patent No. 3027441, the present applicant disclosed a lead-free solder in which Cu is added to a Sn—Ag alloy. Of the compositions disclosed in that patent, Sn-3Ag-0.5Cu is superior with respect to properties such as solderability, bonding strength, and resistance to thermal fatigue. Therefore, at present, that alloy is much used in the soldering of electronic devices. It is also used to form solder balls for forming bumps for BGA packages.

When a Sn—Ag—Cu based lead-free solder is formed into solder balls, the surface of the solder balls may not be perfectly smooth and may have surface irregularities. Such surface irregularities are undesirable because they may prevent the solder balls from smoothly rolling and may prevent the solder balls from being accurately supplied to a mounting apparatus for mounting solder balls on a BGA substrate. In order to eliminate irregularities on the surface of a Sn—Ag—Cu based lead-free solder, Japanese Published Unexamined Patent Application No. 2002-57177 discloses solder balls in which 0.006-0.1 mass % of at least one of Ge, Ni, P, Mn, Au, Pd, Pt, S, Bi, Sb, and In is added to a Sn—Ag—Cu based alloy.

The solder balls of that patent application do not have surface irregularities, so they can be smoothly and accurately supplied to a mounting apparatus for solder balls. In addition, they have a high bonding strength. According to that patent application, Ge has the effect of preventing oxidation, Ni, P, Mn, Au, Pd, Pt, S, and In have the effects of lowering the melting point and increasing the bonding strength, and Sb has the effect of increasing strength.

DISCLOSURE OF THE INVENTION

When using solder balls to form solder bumps on a BGA package, the solder balls are typically held by a suction jig of a mounting device and are moved by the jig to a prescribed location above the substrate of the BGA package. The solder balls are then released by the suction jig to place them atop the electrodes of the BGA substrate. The BGA substrate with the solder balls disposed atop it is then heated to a suitable temperature in a reflow furnace to melt the solder balls and form them into bumps atop the electrodes of the BGA substrate.

If even a single solder bump is missing or improperly positioned atop a BGA substrate, the entire BGA package is likely to be defective. Therefore, after heating of the BGA substrate and the solder balls in a reflow furnace to form the solder balls into solder bumps, the bottom surface of the BGA package is inspected with image processing equipment to determine if any of the bumps are missing or mispositioned. The image processing equipment relies on light reflected from the surface of the solder bumps. Yellowing of the surface of the solder bumps reduces their reflectivity and may cause the image processing equipment to make an inaccurate determination that a solder bump is missing or mispositioned. Therefore, surface yellowing of solder bumps during reflow is undesirable. Surface yellowing is also undesirable because, according to conventional knowledge, it is thought to be indicative of deterioration of metal.

The solder balls disclosed in Japanese Published Unexamined Patent Application No. 2002-57177 are improved with respect to surface irregularities, so they can be easily and accurately supplied to a BGA substrate. However, those solder balls do not have adequate solderability, i.e., wettability with respect to the electrodes of a BGA substrate or the lands of a printed circuit board.

The solder balls disclosed in that patent application have a high bonding strength when they are in the form of large-diameter solder balls, such as solder balls with a diameter larger than 0.5 mm. This is because the bonding strength of the solder itself is high. However, particularly when the diameter of the solder balls is 0.5 mm or less, the bonding strength of the solder balls may become low.

In addition, there are cases in which solder bumps made from those solder balls peel off a substrate to which they are soldered after a long period of use, so an improvement in their reliability is desired.

It is an object of the present invention to provide a solder ball having an excellent bonding strength even when it has a small diameter, which does not undergo yellowing, and which has good bonding reliability over a long period.

The present inventors performed various investigations with the object of developing an improved solder ball for use in forming solder bumps. As a result of these investigations, they made the following findings and thereby completed the present invention.

(1) The cause of a decrease in the bonding strength of solder balls with a small diameter is that when voids develop in a solder joint, the proportion of the solder joint occupied by the voids is large. Voids which develop in a soldered joint at the time of soldering have about the same size regardless of the size of the joint, so the proportion of the joint occupied by voids is smaller when the joint is large, and an adequate strength can be guaranteed by the portions of the joint where there are no voids. However, when a soldered joint is small, such as is the case with joints formed using small-diameter solder balls, the proportion of the joint occupied by voids becomes larger, and the area in which the solder of the joint and electrodes of an electronic part or the lands of a printed circuit board are actually bonded to each other is decreased, so the bonding strength of the joint becomes weak.

(2) Upon investigating the wettability of and formation of voids by a Sn—Ag—Cu—P based lead free solder, the present inventors found that the P content has a large effect on wettability of and the formation of voids by the solder. Namely, if the P content of a Sn—Ag—Cu—P based lead-free solder is too high, the solderability of the solder is impaired and voids are formed in a soldered joint, resulting in a reduced bonding strength.

However, the addition of P has the benefit of preventing yellowing of the surface of solder, so it is undesirable to completely eliminate P from Sn—Ag—Cu based lead-free solder balls.

As a result of further research, the present inventors discovered that if the P content of a Sn—Ag—Cu—P based solder is an appropriate level, it is possible to prevent P from having an adverse effect on wettability and void formation while enabling P to effectively prevent surface yellowing of solder balls made from the soldering during heating.

(3) The most important property of solder is its reliability in bonding. Peeling of solder bumps from a surface to which they are bonded causes conducting defects, so it is an undesirable phenomenon. Therefore, bonding reliability is considered more important than the strength of the solder itself. As demonstrated by the below-described examples, the present inventors found that the addition of a minute amount of P to a solder ball comprising a Sn—Ag—Cu based lead-free solder alloy in the above-described range has a marked and unexpected effect on increasing the long-term reliability of soldered portions.

Therefore, among other features, the present invention provides a lead-free solder ball comprising 1.0-4.0 mass % of Ag, 0.05-2.0 mass % of Cu, 0.0005-0.005 mass % of P, and a remainder of Sn.

The surface of a solder ball according to the present invention does not undergo surface yellowing after it is formed into a solder bump, it can provide a high bonding strength even when it has a small diameter, and it can provide bonding reliability over a long period of time. Therefore, it is highly suitable for use in the manufacture of BGA packages.

BEST MODE FOR CARRYING OUT THE INVENTION

Figure 1:
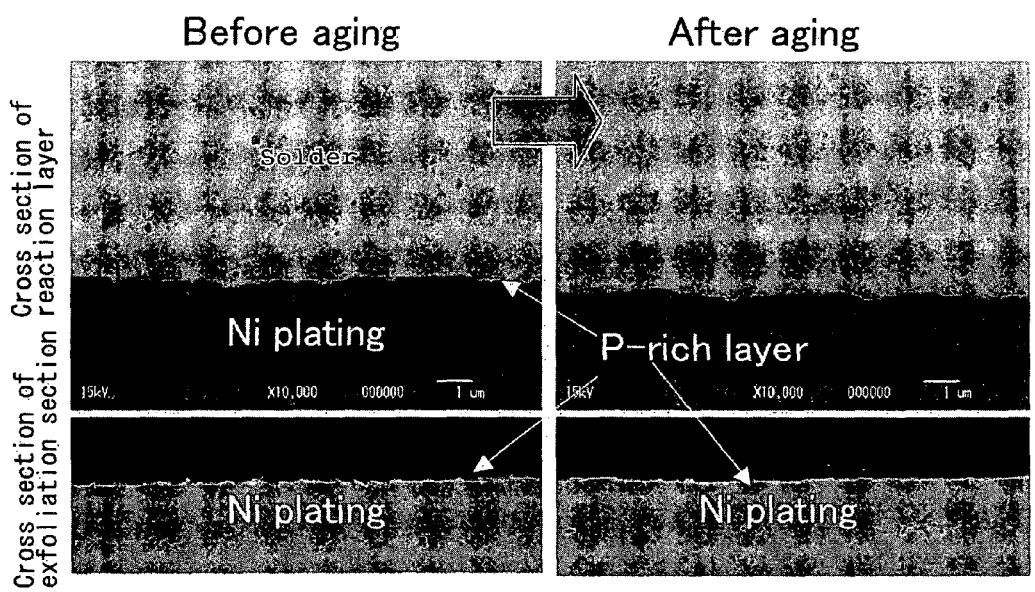
FIG. 1 is a photomicrograph of cross sections of solder bumps formed on an Au-plated substrate before and after undergoing a pull test when the solder does not contain P.

The reasons for the limits on the components of an alloy composition of a lead-free solder ball according to the present invention will next be explained. In the following explanation, unless otherwise specified, % refers to mass %.

In a lead-free solder ball according to the present invention, if the content of Ag is smaller than 1.0 mass %, the liquidus temperature becomes high, the soldering temperature necessarily also becomes high, and the probability of a BGA package or other electronic part undergoing thermal damage during soldering with the solder ball is increased. Ag is also an element which affects solderability. If the content of Ag is less than 1.0 mass %, solderability becomes poor and the likelihood of soldering defects increases. However, if the content of Ag exceeds 4.0 mass %, marked coarsening of AgSn compounds occurs and the reliability of bonding is decreased. In addition, the soldering temperature undesirably increases due to an increase in the liquidus temperature of the solder alloy. Therefore, the lower limit on Ag in the present invention is 1.0 mass %, and the upper limit is 4.0 mass %. Preferably, the Ag content is 1.0-3.5 mass %.

In a Sn—Ag based alloy, the addition of Cu decreases the melting temperature of the alloy and increases its strength. If the Cu content is less than 0.05 mass %, these effects are not obtained. However, if the content of Cu exceeds 2.0 mass %, the liquidus temperature of the alloy increases, so not only does the soldering temperature become high, but a large amount of SnCu intermetallic compounds precipitate to worsen solderability. Therefore, the Cu content is 0.05-2.0 mass % and preferably 0.05-0.75 mass %.

In a solder alloy having Sn as a main component, the addition of P is effective not only at preventing peeling of solder bumps after aging but also at preventing yellowing. However, if a large amount of P is added, its presence worsens wettability and causes the formation of voids. In a Sn—Ag—Cu based alloy, if the content of P is less than 0.0005 mass %, the effect of P on preventing yellowing is not obtained, while if the P content exceeds 0.005 mass %, the addition of P worsens solderability and causes the formation of voids. Therefore, in the present invention, the P content is 0.0005-0.005 mass %.

A lead-free solder ball according to the present invention preferably does not undergo yellowing of its surface after being mounted on an electrode of a BGA substrate and being melted by heating in a reflow furnace to form a solder bump. This is because, as stated earlier, surface yellowing can cause errors to occur during the inspection of solder bumps of a BGA package with image processing equipment.

In addition, a lead-free solder ball according to the present invention preferably does not undergo yellowing after sitting at a high temperature even without melting. The reason why yellowing of the solder ball preferably does not take place after sitting at a high temperature is that the absence of surface yellowing is a requirement of acceptance tests performed by the users of lead-free solder balls. If surface yellowing of solder balls does not take place during sitting at a high temperature, yellowing will not take place at the time of melting.

Solder balls used for many BGA packages most commonly have a diameter of 0.5-0.76 mm, but for CSP and wafers, minute solder balls with a diameter of 0.04-0.5 mm are used. A lead-free solder ball according to the present invention has an extremely low occurrence of voids, so it can maintain a high bonding strength when in the form of a minute sphere. As a result, a solder ball according to the present invention can increase the reliability of minute solder balls with a diameter of 0.04-0.5 mm.

During use, BGA devices in electronic equipment are often exposed to high temperatures which may exceed 100° C. By using solder balls according to the present invention to form solder bumps, solder bumps can be obtained which do not undergo peeling but which actually undergo an increase in bonding strength as a result of aging, resulting in enhanced bonding reliability in severe environments of use.

There are no particular restrictions on a method of manufacturing a solder ball according to the present invention, and it may be manufactured using any convenient method. For example, it may be manufactured by the oil bath method, in which pieces of solder are dropped into a bath of heated oil, or by the direct method, in which molten solder is dripped or allowed to fall in droplets of a given size through an orifice or nozzle and is solidified while falling through a chamber. Both of these methods are well known to those skilled in the art and so will not be described here in detail.

EXAMPLES

The present invention will be described in further detail by the following examples.

Example 1

Solder alloys having the compositions shown in Table 1 were prepared to evaluate the following characteristics. The results are shown in Table 1.

The solidus temperature (S.T.) and the liquidus temperature (L.T.) were determined for each alloy from the heating curve obtained by differential thermal analysis.

Solder balls having a diameter of 0.5 mm were prepared by the oil bath method. Yellowing was evaluated by disposing the solder balls in air at 125° C. for 12 hours and then visually observing the surface of the balls for the degree of surface yellowing. Solder balls which had no surface yellowing at all were evaluated as good, those having a small amount of yellowing were evaluated as fair, and those having severe yellowing were evaluated as poor.

In order to evaluate the solder balls for the occurrence of voids, the solder balls were placed on the electrodes of a BGA substrate and then heated in a reflow furnace in a nitrogen atmosphere containing 100 ppm or less of oxygen in which the BGA substrate was maintained for 40 seconds at a temperature above the L.T. with a peak temperature of 240° C. to form the solder balls into solder bumps. The solder bumps were then inspected for the presence of voids using a TOSMICRON FP7160F9 x-ray inspection apparatus manufactured by Toshiba Corporation. The bumps were evaluated based on the amount of voids. Solder bumps for which the amount of voids is less than 10% were evaluated as good, those for which the amount of voids is 10-30% were evaluated as fair, and those for which the amount of voids is over 30% were evaluated as poor.

The results of the above-described evaluations are shown in Table 1.

From the results shown in Table 1, it can be seen that a lead-free solder ball according to the present invention does not undergo significant surface yellowing or develop a significant amount of voids.

Accordingly, when a lead-free solder ball according to the present invention is formed into a bump on a BGA substrate and the bump is inspected with image processing equipment, errors due to surface yellowing do not occur, so inspection can be accurately carried out. Furthermore, not only is the occurrence of defects at the time of soldering small, but a high bonding strength is obtained.

TABLE 1

| | No. | Composition (%) | | | | Melting Temperature (° C.) | | Yellowing | Occurrence of voids |
|---|---|---|---|---|---|---|---|---|---|
| | | Sn | Ag | Cu | P | S.T. | L.T | | |
| This invention | 1 | rem. | 1.0 | 1.0 | 0.001 | 217 | 235 | good | good |
| | 2 | rem. | 2.0 | 0.3 | 0.003 | 217 | 223 | good | good |
| | 3 | rem. | 3.0 | 0.5 | 0.003 | 217 | 220 | good | good |
| | 4 | rem. | 3.0 | 2.0 | 0.005 | 217 | 284 | good | fair |
| | 5 | rem. | 3.5 | 0.05 | 0.004 | 221 | 221 | good | fair |
| | 6 | rem. | 3.5 | 0.75 | 0.0005 | 218 | 219 | fair | fair |
| | 7 | rem. | 4.0 | 0.5 | 0.002 | 217 | 229 | good | good |
| Comparative examples | 1 | rem. | 3.0 | 0.5 | — | 217 | 220 | poor | good |
| | 2 | rem. | 3.0 | 0.5 | 0.017 | 217 | 220 | good | poor |
| | 3 | rem. | 3.5 | — | — | 221 | 221 | poor | good |

Example 2

In this example, the effect of the addition of P on the bonding reliability of a solder ball according to the present invention before and after aging, i.e., exposure to a high temperature was measured.

The solder compositions shown in Tables 2 and 3 which contained 0-400 ppm of P in Sn-3.0Ag-0.5Cu solder alloy or Sn-4.0Ag-0.5Cu solder alloy were used to prepare solder balls having a diameter of 0.5 mm by the oil bath method. The solder balls were placed on the lands of a printed circuit board and then heated in a reflow furnace to form the solder balls into solder bumps. The printed circuit board was either one with Au plating or one with Cu-OSP (Organic Surface Preflux). The reflow furnace contained an $N_2$ atmosphere with an oxygen concentration of at most 100 ppm. Reflow was performed for 40 seconds at a temperature higher than the liquidus temperature with a peak temperature of 240° C.

The resulting solder bumps were then subjected to aging in air at 150° C. for 200 hours. Both before and after aging, the solder bumps were subjected to a pull test using a Dage Series 4000 tester with a pull speed of 300 μm/second for 2 seconds. The percent of bumps which underwent peeling in the pull test before or after aging out of a sample of 50 bumps is show in Tables 2 and 3. The lower the percent of bumps which underwent peeling the better. The pull strength is shown in ( ), which is the average of the maximum strength for 50 bumps each obtained during pull testing for 2 seconds.

TABLE 2

Properties of solder bumps formed on a Au-plated circuit board

| | P content | Peeling rate (%) in pull test | |
|---|---|---|---|
| Solder composition | (mass %) | After reflow | After aging |
| Sn—3.0Ag—0.5Cu—P | 0 | 22 (11.31N) | 10 (9.62N) |
| | 0.001 | 18 (11.27N) | 0 (9.21N) |
| | 0.003 | 22 (11.41N) | 0 (9.57N) |
| | 0.005 | 24 (11.71N) | 0 (9.82N) |
| | 0.040 | 28 (11.03N) | 8 (9.23N) |
| Sn—4.0Ag—0.5Cu—P | 0 | 56 (12.56N) | 18 (10.67N) |
| | 0.001 | 54 (12.33N) | 0 (10.91N) |
| | 0.003 | 54 (12.28N) | 0 (10.46N) |
| | 0.005 | 52 (12.68N) | 0 (10.49N) |
| | 0.040 | 56 (12.81N) | 28 (11.07N) |

TABLE 3

Properties of solder bumps formed on a Cu-OSP circuit board

| | P content | Peeling rate (%) in pull test | |
|---|---|---|---|
| Solder composition | (mass %) | After reflow | After aging |
| Sn—3.0Ag—0.5Cu—P | 0 | 90 (10.35N) | 22 (8.21N) |
| | 0.001 | 88 (10.52N) | 0 (8.87N) |
| | 0.003 | 88 (10.78N) | 0 (8.83N) |
| | 0.005 | 64 (10.22N) | 0 (8.51N) |
| | 0.040 | 74 (10.94N) | 24 (8.22N) |
| Sn—4.0Ag—0.5Cu—P | 0 | 64 (11.58N) | 24 (9.33N) |
| | 0.001 | 82 (11.04N) | 0 (9.39N) |
| | 0.003 | 68 (11.67N) | 0 (9.86N) |
| | 0.005 | 72 (11.29N) | 0 (9.44N) |
| | 0.040 | 80 (11.65N) | 32 (9.91N) |

From Tables 2 and 3, it can be seen that the rate of peeling immediately after reflow was not significantly influenced by the presence of P. However, after aging, for both the Au-plated and preflux circuit boards, the solder alloy containing P had a much larger decrease in the rate of peeling.

This effect was due to the addition of a minute amount of P changing the structure of the bonding reaction layer.

FIGS. 1 to 4 show photomicrographs of cross sections before and after peeling of solder bumps made from a Sn-3.0Ag-0.5Cu or a Sn-3.0Ag-0.5Cu-0.003P solder ball.

Figure 2:
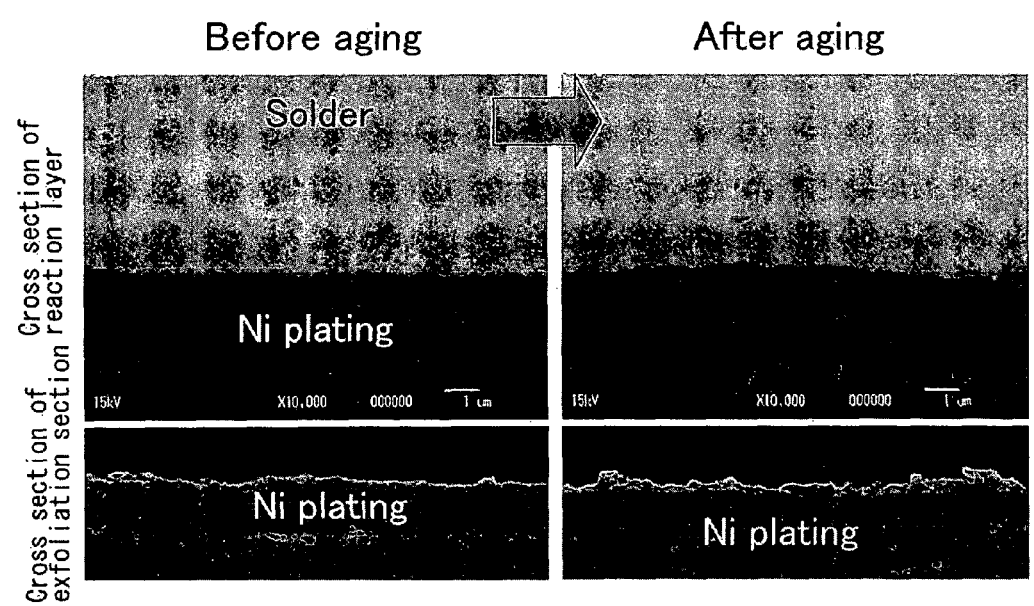
FIG. 2 is a photomicrograph of cross sections of solder bumps formed on an Au-plated substrate before and after undergoing a pull test when the solder contains P.
Figure 3:
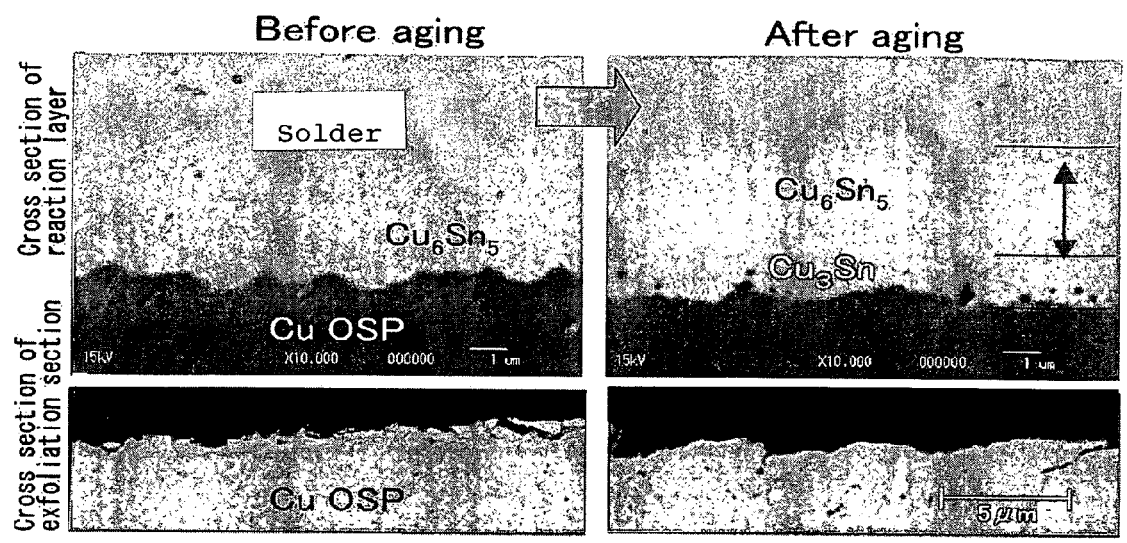
FIG. 3 is a photomicrograph of cross sections of solder bumps formed on a Cu-OSP (Organic Surface Preflux) substrate; hereunder merely referred to as "preflux substrate", before and after undergoing a pull test when the solder does not contain P.
Figure 4:
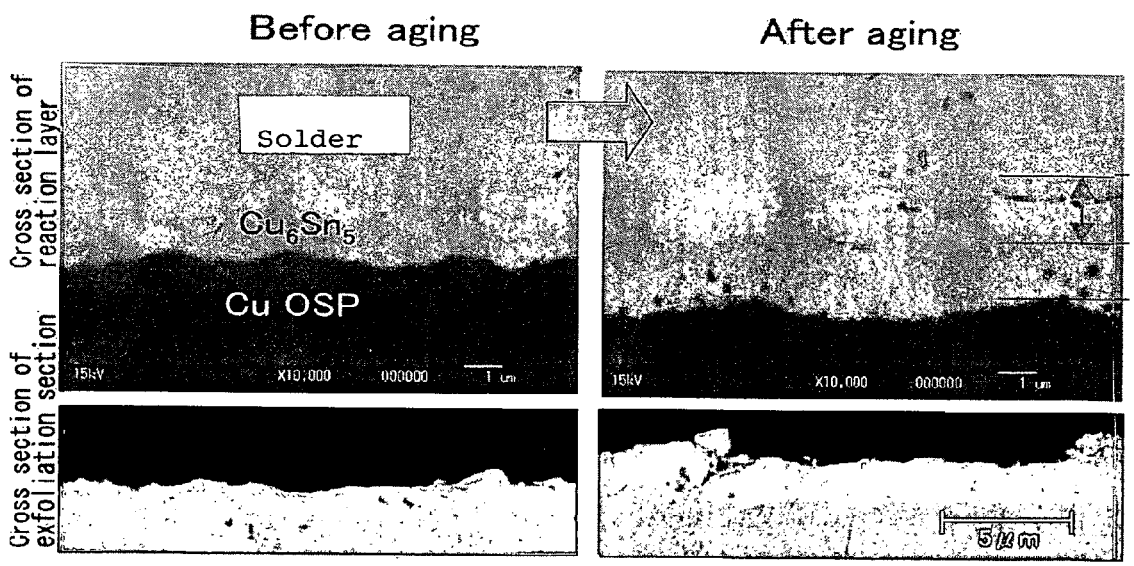
FIG. 4 is a photomicrograph of cross sections of solder bumps formed on a preflux substrate before and after undergoing a pull test when the solder contains P.

The solder bumps shown in FIGS. 1 and 2 were formed on an electroless Ni undercoat of the Au-plated circuit board, while the solder bumps shown in FIGS. 3 and 4 were formed on a Cu undercoat of the preflux circuit board. Views (a) and (b) in each figure each show a cross section of a bump bonded to one of the circuit boards, while views (c) and (d) in each figure each show a cross section of the surface where peeling took place when a bump was peeled off the circuit board in the above-described pull test. The photomicrographs on the left-hand side of each figure shows cross sections before aging, and those on the righthand side of each figure shows cross sections after aging.

For both types of circuit board, the reaction layer prior to aging was not affected by whether P was present or not in the solder alloy forming the solder bumps. The peeled surface resulting from the pull test was the interface between a P-rich layer (when P was added) and a reaction layer for the Au-plated circuit board, and it was the interface between Cu and $Cu_6Sn_5$ for the preflux circuit board.

For the Au-plated circuit board, the peeled surface after aging was the same as the interface between the P-rich layer and the reaction layer when the solder alloy contained no P, but for the solder alloy containing P, the peeled surface moved to within the reaction layer (the interface between the first layer and the second layer).

For the preflux circuit board, the peeled surface was the $Cu_3Sn/Cu_6Sn_5$ interface for both alloy compositions, but for the composition containing P, the $Cu_6Sn_5$ layer shown by an arrow in FIGS. 3 and 4 was thin.

In this manner, due to the formation of a second layer in the case of a Au-plated circuit board and due to the thinning of the $Cu_6Sn_5$ layer in the case of a preflux circuit board, bonding reliability is increased during use over long periods and in high temperature environments.

The above-described effect of the addition of P on increasing bonding reliability is a phenomenon which was first discovered by the present inventors. This effect is not influenced by the diameter of a solder ball.

INDUSTRIAL APPLICABILITY

Even when a lead-free solder ball according to the present invention is melted or exposed to a high temperature, its surface does not turn yellow. Accordingly, after solder bumps are formed on the electrodes of a BGA package using lead-free solder balls according to the present invention, accurate inspection can be carried out with image processing equipment to determine whether solder bumps have been properly formed.

In addition, a lead-free solder ball according to the present invention has excellent wettability with respect to the electrodes of a BGA package or the lands of a printed circuit board, so not only is there no occurrence of soldering defects, but the occurrence of voids is extremely small, so a high bonding strength is obtained.

A lead-free solder ball according to the present invention provides the above-described excellent effects when used to form solder bumps on a BGA package, but it can also be used to form solder bumps on other members, such as on wafers which have even smaller electrodes than BGA packages. Solder balls for forming bumps on wafers have an extremely small diameter of 0.1 mm or less, and the bonding area is extremely small, so if even a small void occurs in a soldered joint, the void has a large effect on the bonding strength.

However, a lead-free solder ball according to the present invention has almost no occurrence of voids, so when it is used to form a solder bump on a wafer, a high bonding strength is obtained.

In addition, a solder ball according to the present invention can form a solder bump having excellent bonding reliability even when exposed to a high temperature environment over a long period. In particular, the present invention provides the unexpected effect that due to the addition of a minute amount of P, aging results in a marked improvement in resistance to peeling. Thus, when the resulting substrates are installed in automobiles or industrial apparatus, in which the substrates are usually coated with a resin such as silicone, such effects as caused by aging are advantageous. Therefore, a solder ball according to the present invention can greatly contribute to increasing the reliability of electronic equipment.

The invention claimed is:

1. A lead-free solder ball comprising a spherical mass of solder consisting of 1.0-4.0 mass % of Ag, 0.05-2.0 mass % of Cu, 0.0005-0.005 mass % of P, and a remainder of Sn.

2. A lead-free solder ball as claimed in claim 1 wherein the solder contains 1.0-3.5 mass % of Ag.

3. A lead-free solder ball as claimed in claim 1 wherein the solder contains 0.05-075 mass % of Cu.

4. A lead-free solder ball as claimed in claim 1 having a diameter of 0.04-0.5 mm.

5. A solder ball arrangement comprising:
a substrate; and
a solder ball disposed on an electrically conducting portion of the substrate, the solder ball comprising a spherical mass of solder consisting of 1.0-4.0 mass % of Ag, 0.05-2.0 mass % of Cu, 0.0005-0.005 mass % of P, and a remainder of Sn.

6. A solder ball arrangement as claimed in claim 5 wherein the solder ball is disposed on an electrode of a BGA substrate.

7. A solder ball arrangement as claimed in claim 5 wherein the solder ball is disposed on a land of a printed circuit board.

8. A solder ball arrangement as claimed in claim 5 wherein the solder ball has a diameter of 0.04-0.5 mm.

* * * * *